United States Patent [19]
Liu et al.

[11] Patent Number: 5,206,526
[45] Date of Patent: Apr. 27, 1993

[54] STAIRCASE BANDGAP PHOTODETECTOR USING RECOMBINATION

[75] Inventors: Chun-Ting Liu, Piscataway; Sergey Luryi, Bridgewater, both of N.J.

[73] Assignee: AT&T Bell Laboratories, Murray Hill, N.J.

[21] Appl. No.: 699,057

[22] Filed: May 13, 1991

[51] Int. Cl.$^5$ .................................. H01L 31/0304
[52] U.S. Cl. ...................... 257/185; 257/21; 257/290; 257/432
[58] Field of Search ................. 357/16, 4, 30

[56] References Cited

U.S. PATENT DOCUMENTS

| | | | |
|---|---|---|---|
| 4,694,318 | 9/1987 | Capasso et al. | 357/16 |
| 4,974,044 | 11/1990 | Cunningham et al. | 357/16 |
| 5,051,804 | 9/1991 | Morse et al. | 357/16 |
| 5,075,743 | 12/1991 | Behfar-Rad | 357/16 |

OTHER PUBLICATIONS

"New Transient Electrical Polarization Phenomenon in Sawtooth Superlattices", by F. Capasso et al., *Physical Review Letters*, vol. 51, No. 25, pp. 2318-2321.

"Measurement of High-Speed Signals in Solid State Devices", by R. B. Marcus (editor), *Semiconductors and Semimetals*, pp. 85-98.

"Picosecond Photoconductivity in Radiation-Damaged Silicon-on-Sapphire Films", by P. R. Smith et al., *Applied Physics Letters*, vol. 38 (1), Jan. 1, 1981, pp. 47-50.

"High Speed, Ion Bombarded InGaAs Photoconductors", by P. M. Downey et al., *Applied Physics Letters*, vol. 46 (4), Feb. 15, 1985, pp. 396-398.

"Room-Temperature Photopumped Operation of an InGaAs-InP Vertical Cavity Surface-Emitting Laser", by D. G. Deppe et al., *Applied Physics Letters*, vol. 56 (22), May 28, 1990, pp. 2172-2174.

*Primary Examiner*—William D. Larkins
*Attorney, Agent, or Firm*—E. E. Pacher

[57] ABSTRACT

Disclosed are novel fast semiconductor photodetector means that comprise a good asymmetric superlattice structure. Associated with the material of the structure is a relatively short minority carrier effective lifetime $\tau_e$, typically $\tau_e < 10^{-9}$ sec. In response to a constant photon flux of appropriate wavelength the photodetector can have a substantially constant voltage output that is proportional to the photon flux for small values of flux, and that saturates at a value that is substantially proportional to $\tau_e^{-1}$ for relatively large values of flux. The novel photodetector means can be advantageously combined with a FET or bipolar transistor, and the combination can be part of an integrated circuit.

10 Claims, 3 Drawing Sheets

STAIRCASE BANDGAP PHOTODETECTOR USING RECOMBINATION

FIELD OF THE INVENTION

This invention pertains to the field of opto-electronic semiconductor devices. More particularly, it pertains to opto-electronic quantum well devices.

BACKGROUND OF THE INVENTION

Semiconductor devices that can efficiently and sensitively detect optical signals are of obvious interest in a variety of technological fields, (e.g., in optical communications), particularly if the devices can have high bandwidth (e.g., in excess of 1 GHz or, preferably, several GHz). A novel fast, efficient semiconductor photodetector thus would be of interest.

Known semiconductor photodetectors typically have an (electrical) output that is substantially proportional to incident light intensity, frequently necessitating provision of circuitry to protect the (typically highly sensitive) input amplifier against overload. Availability of a photodetector whose output saturates at some convenient level could result in simpler and therefore less costly detection apparatus and thus would be of interest. Furthermore, known semiconductor high speed photodetectors typically have the characteristics of a current source, requiring the use of a load resistor to provide a voltage signal to the input amplifier. Availability of a photodetector substantially having the characteristics of a voltage source could result in simplified apparatus. This application discloses a novel device having these and other advantageous features.

F. Capasso et al. (*Physical Review Letters*, Vol. 25, pp. 2318–2321) described a transient electrical polarization phenomenon in sawtooth superlattices. The effect was observed in a p-doped graded-gap AlGaAs structure such as is schematically depicted in FIG. 1, wherein $E_C$ and $E_V$ refer to the conduction band edge and the valence band edge, respectively, and $E_F$ is the Fermi energy. The superlattice period d is also indicated. Band diagrams such as FIG. 1 are well known to those skilled in the art.

Sudden illumination of the structure of FIG. 1 with high energy (i.e., of energy greater than the minimum bandgap) photons was observed to give rise to a substantial transient voltage across the superlattice, with the voltage decaying rapidly, with a time constant of order $\tau_M$, the Maxwell relaxation time. No steady-state polarization was observed under dc illumination.

The effect arises when the electron transit time $\tau_d$ across one superlattice period d is shorter than $\tau_M$ of the p-doped material. An abrupt light pulse generates electron-hole pairs and sets electrons in motion that temporarily upset the local balance of charge. Because of the sawtooth asymmetry of the superlattice, the polarization from each period adds up, analogously to a pyroelectric, developing a voltage across the superlattice. The rise time of the prior art transient polarization voltage is also of order $\tau_M$.

SUMMARY OF THE INVENTION

In a broad aspect the invention is an article that comprises semiconductor photodetector means that can substantially have the characteristics of a voltage source, and whose output voltage is substantially proportional to the incident photon flux for relatively small values of the flux, and saturating at a value $V_{max}$ for relatively large values of the flux. We have discovered that photodetector means having these attributes can for instance be made by appropriately modifying a superlattice structure of the type used by Capasso et al. to demonstrate the transient internal photo-polarization effect.

More specifically, the inventive photodetector means comprise a semiconductor body having a major surface and comprising a doped region whose chemical composition varies periodically as a function of distance from the surface. This region will be referred to as the "superlattice region". Associated with the semiconductor material in the superlattice region is a minority carrier effective lifetime $\tau_e$. The period compositional variation in the superlattice region is such that each period lacks reflection symmetry in any plane parallel to the surface, whereby absorption of photons in the superlattice region can result in the appearance of a voltage across the superlattice region. The inventive photodetector means also comprise means for making electrical contact with the semiconductor body such that said voltage across the superlattice region can be provided to responsive means.

Significantly, in the superlattice region of devices according to the invention the minority carrier effective lifetime $\tau_e$ is short, (typically $<10^{-9}$ seconds, preferably $<10^{-10}$ or even $10^{-11}$ seconds), selected such that a constant photon flux impinging on the semiconductor body can result in a substantially constant voltage across the superlattice region, said voltage being substantially proportional to the photon flux for relatively small values of flux, and saturating at a value $V_{max}$ (that is inversely proportional to $\tau_e$ and is at least about 0.01 V per superlattice period at room temperature) for relatively large values of the flux. In general, $V_{max}$ will be greater than 0.01 V per superlattice period only if $\tau_e$ is substantially less than $10^{-9}$ seconds;

The required short effective lifetime can be attained by any appropriate means. Among these is ion bombardment of the superlattice region to introduce lattice defects, growth of the material of the superlattice region (e.g., by MBE) at relatively low temperature, or by stimulated recombination in predetermined portions of the superlattice region.

The term "minority carrier effective lifetime" herein is intended to be synonymous with "minority carrier lifetime", and is furthermore used in the conventional sense, namely, as the time from electron/hole generation to recombination. The minority carrier lifetime need not be constant over the superlattice region. Those skilled in the art will appreciate that in a device according to the invention the operatively significant lifetime is the lifetime in the region (or regions) of the superlattice at which the bandgap energy is minimum.

DETAILED DESCRIPTION

Figure 2:
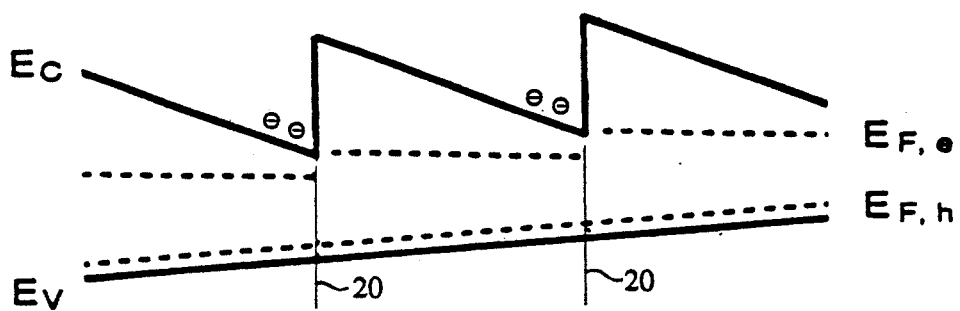
FIGS. 2–5 and FIG. 10 schematically depict exemplary superlattice structures that can be used in the practice of the invention.

FIGS. 2-5 schematically depict exemplary superlattice structures that can be used in articles according to the invention. All of them exhibit a lack of reflection symmetry in the planes parallel to the superlattice. This lack of reflection symmetry is a necessary condition for the existence of the dc photo-polarization effect according to the invention. In FIGS. 2-5 it is assumed that the superlattice is p-doped, such that electrons are the minority carriers. This is not a requirement, and embodiments of the invention with n-doped superlattice are possible. However, for simplicity's sake the discussion herein will be primarily in terms of p-doped structures, and will frequently be in terms of a simple saw-tooth structure such as is shown in FIG. 2.

Superlattice structures according to the invention can be readily produced by known means, e.g., by MBE growth of $Al_{1-x}Ga_xAs$ on a GaAs substrate, with x varied to result in the desired grading or step-like variation. The number N of superlattice periods typically will be greater than 1, although the effect does exist even for N=1. However, since the output voltage of a device according to the invention is directly proportional to N (provided $Nd \lesssim a^-$, where $\alpha$ is the absorption coefficient), it will typically be desirable for N to be substantially greater than 1, e.g., N to be of order 10.

Under appropriate dc illumination (i.e., substantially constant for a period at least of length $10\tau_M$), the generation of electron-hole pairs typically will be approximately uniform over the superlattice structure, whereas re-combination occurs predominantly at the positions of minimum bandgap (e.g., 20 of FIG. 2), where the minority-carrier concentration is highest. A steady-state supply of majority carriers must be provided by a gradient of the hole quasi-Fermi level, $E_{F,h}$, which causes the necessary hole current into the narrow bandgap regions (20) of the superlattice. In the absence of an external current, the electron and hole fluxes are equal at every point in the superlattice. Because of the asymmetry of the superlattice, the electron current is predominantly directed along the conduction band gradient. This ensures the substantially unidirectional nature of the hole flow. Hence, a non-vanishing difference (designated $eV_1$, where e is the electron charge) in the hole quasi Fermi level is generated in each superlattice period. These differences add up to a finite (steady state) voltage V between the top and the bottom layer of the superlattice. Our theoretical analysis has shown that $$V = NV_1 = NGd^2/(2\mu_h p_o) \approx \phi d/(2\mu_h p_o), \tag{1}$$

where V, N, $V_1$ and d have been defined previously, the pair generation rate $G = \alpha\phi$, $\phi$ is the photon flux, $\mu_h$ is the hole mobility, and $p_o$ is the hole concentration provided by doping. The approximate expression in the right-hand side of equation 1 results under the assumption that N is chosen such that $\alpha Nd \sim 1$, so that most of the incident light is absorbed by the superlattice.

Our analysis has also shown that for a sufficiently high generation rate and/or long lifetime such that $G\tau_e > p_o$ (where $\tau_e$ is the minority carrier effective lifetime) the steady state voltage saturates at $$V_{max} \sim Nd^2/2\mu_h\tau_e. \tag{2}$$

Substituting parameter values applicable to the above cited Capasso et al. work (namely, N=10, d=50 nm, $\mu_h \sim 100$ cm$^2$/V·sec, and $\tau_e \sim 10^{-8}$ sec), one finds that the prior art structure could have yielded a steady state photovoltage of only about $10^{-4}$ V, too small to be noticed, and far too small to be of technological interest.

Figure 4:
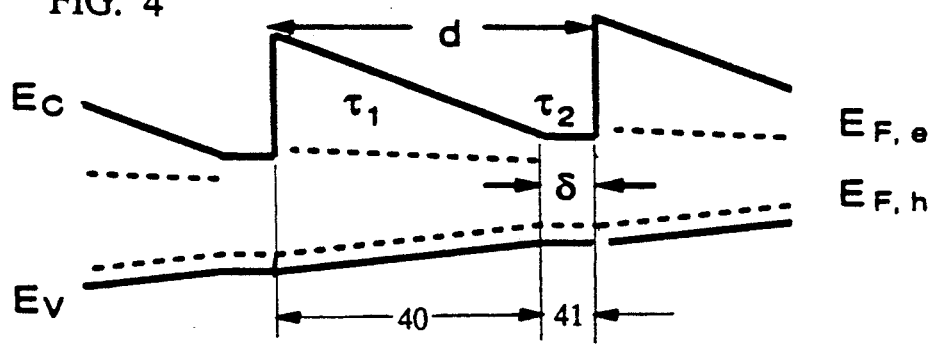

Equations 1 and 2 are derived for the case of substantially uniform $\tau_e$ throughout the superlattice region. However, the invention is not limited to uniform $\tau_e$. For instance, considering a case corresponding to FIG. 4, with minority carrier lifetime in regions 40 and 41 being $\tau_1$ and $\tau_2$, respectively, with $\tau_2 << (\delta/d)\tau_1$, we have shown that $$V_1 \approx Gd(d-\delta)/(2p_o\mu_h) \tag{3}$$

and, $$V_{max} = d\delta/(2\mu_h\tau_2), \tag{4}$$

where $\delta$ is as defined in FIG. 4.

The above-described situation of $\tau_2 << \tau_1$ can be the result of stimulated re-combination due to the presence of photons of appropriate wavelength (longer than the photons that create the electron-hole pairs, and at least equal to the wavelength that corresponds to the minimum energy gap). Those skilled in the art will recognize how to implement an appropriate optical cavity that can achieve the described result.

Figure 3:
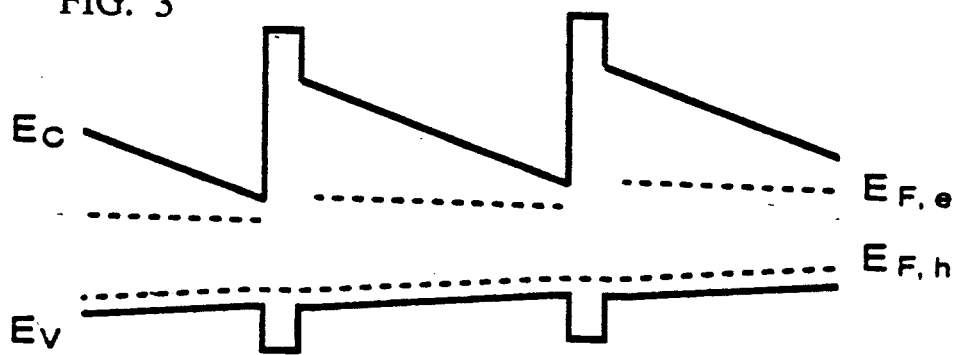

FIG. 3 shows a variant of a sawtooth superlattice, namely, a sawtooth with barrier separators. Such a superlattice structure does not sustain a dc voltage with a conductive load (e.g., a bipolar transistor), but can be used in conjunction with a purely capacitive load (e.g., an FET).

Figure 5:
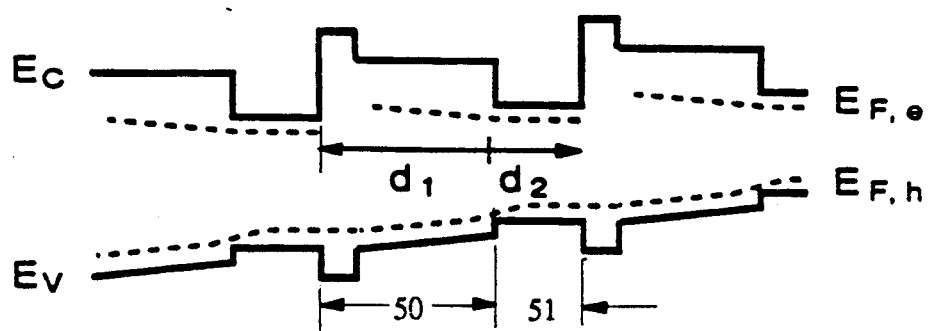

In certain heterostructure materials (e.g., some of the ternary and quaternary III/V compound semiconductors lattice matched to InP), graded-gap sawtooth superlattices are difficult to achieve within the confines of lattice-matched heteroepitaxy. However, the presence of a built-in sawtooth field is not a necessary condition for devices according to the invention. An exemplary non-sawtooth structure is depicted in FIG. 5. Assuming a "large" band discontinuity (i.e. exp $(\Delta/kT) >> \tau_1/\tau_2$, wherein $\tau_1$ and $\tau_2$ are the effective lifetimes associated with regions 50 and 51, respectively; $\Delta$ is the bandgap energy discontinuity, k is the Boltzmann factor and T is the absolute temperature), and a "large" diffusion length $\lambda_i$ (i.e., $\lambda_i >> d_i$; i=1,2), one obtains $$V_1 \gtrsim Gdd_2/(2p_o\mu_h) \tag{5}$$

In the above-assumed case, the electron flux is directed from the wide-gap region into the narrow-gap region. If exp $(\Delta/kT) << \tau_1/\tau_2$ then the electron flux is in the opposite direction. The invention can even be embodied in devices in which $\Delta = 0$, provided $\tau = \tau(x)$. Thus, the necessary asymmetry of the superlattice need not be a bandgap asymmetry but can be a lifetime asymmetry.

Figure 1:
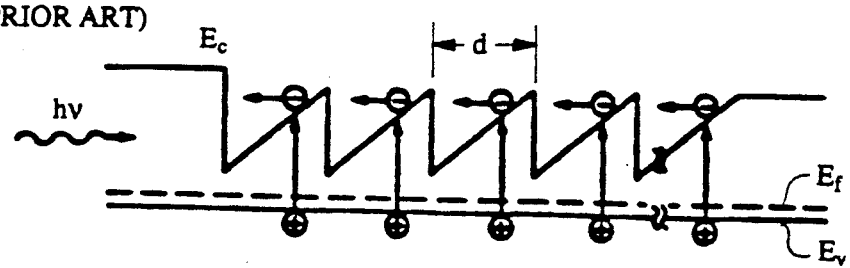
FIG. 1 schematically shows the sawtooth superlattice structure used to demonstrate the prior art transient photo-polarization effect.
Figure 6:
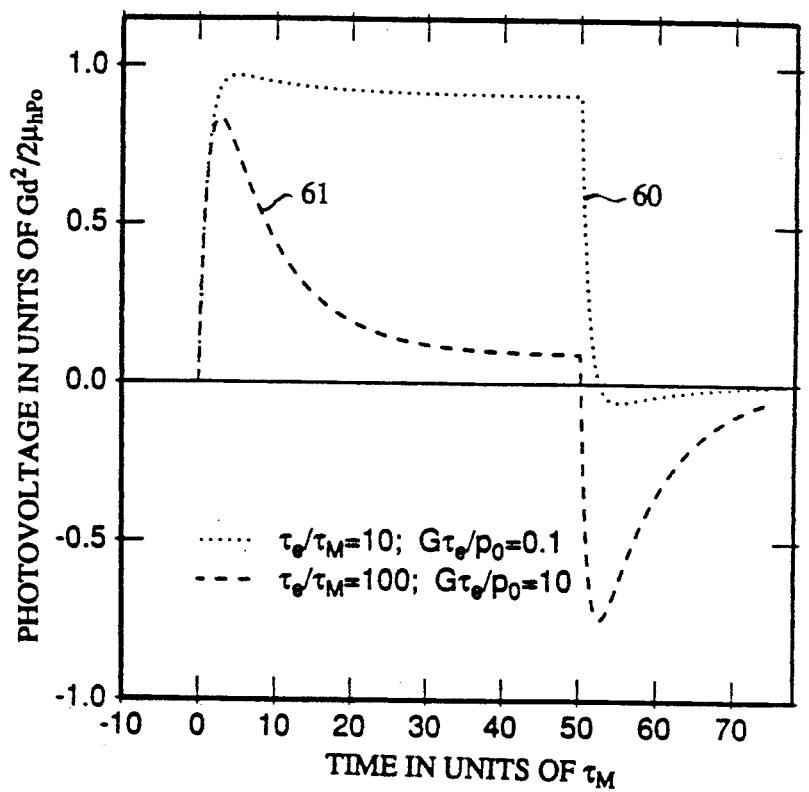
FIG. 6 shows exemplary computed values of the photo-voltage.

FIG. 6 depicts calculated curves of open circuit photovoltage vs. time, for a device according to the invention. A sawtooth profile was assumed, with a light pulse of duration $50\tau_M$, where the Maxwell relaxation time $\tau_M = \epsilon/(e\mu_h p_o)$, where $\epsilon$ is the permittivity of the semiconductor material. An exemplary value of $\tau_M$ is 1 ps. Curve 60 exemplifies the behavior of a device according to the invention (having relatively small $\tau_e$), whereas curve 61 exemplifies behavior somewhat akin to that observed by Capasso et al. Assuming that $\mu_h$ and $p_o$ are the same in both cases, $\tau_e$ and G of curve 61 each are 10 times $\tau_e$ and G of curve 60.

Figure 7:
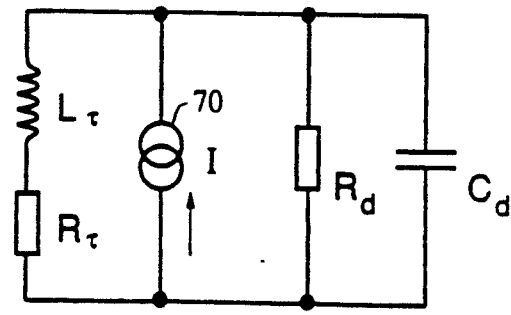
FIG. 7 shows the equivalent circuit of an unloaded device according to the invention.

The behavior of ana unloaded device (of area A) according to the invention can be modeled by the equivalent circuit of FIG. 7, with $C_d = \epsilon A/d$; $R_d = d/(e\mu_h p_o A)$; $R_\tau R_d p_o/(G\tau_e)$; and $L_\tau = \tau_e R_\tau$. The current source 70 produces a current $I \approx AeGd/2$ when light impinges on the device, and $I = 0$ otherwise.

Figure 8:
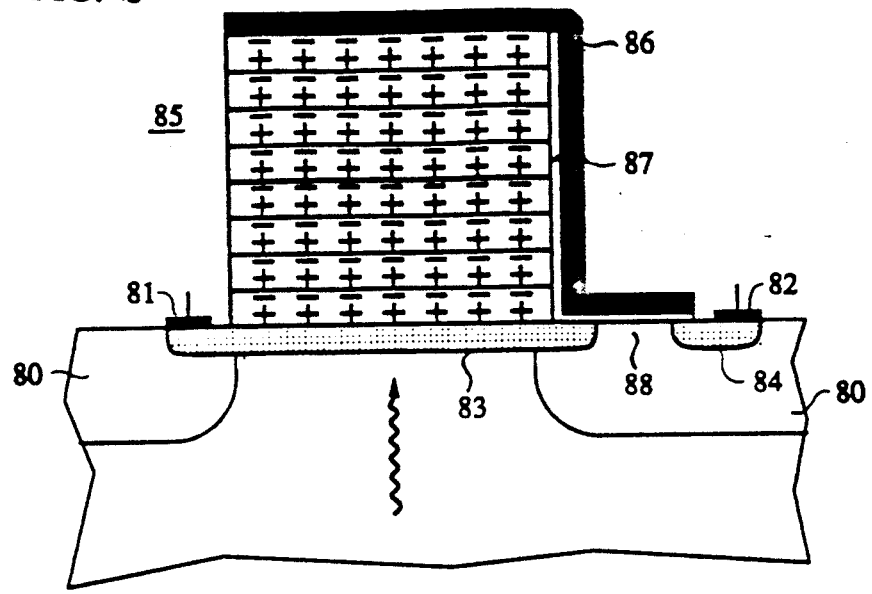
FIG. 8 schematically depicts an exemplary device according to the invention.

Polarizable superlattice detectors according to the invention are advantageously used in conjunction with a voltage-sensitive device such as a FET. They can also be used in conjunction with current-sensitive devices such as bipolar transistors. In that case, however, schemes such as those of FIG. 3 should not be used. An exemplary combination is schematically depicted in FIG. 8, wherein 80 refers to the semiconductor substrate, 85 to the multilayer superlattice, 81 and 82 to source contact and drain contact, respectively, 83 and 84 to appropriately doped semiconductor regions, 86 to metalization that provides the voltage across 85 to the gate region 88, and 87 to an insulator layer. Impinging radiation is indicated by the wavy arrow.

The efficiency $\eta$ of a combination exemplified by FIG. 8 can be shown to be $M\alpha d/2$, where $M = g_m R_{int}$. The efficiency is defined as the number of electrons flowing through the drain of the FET per photon incident on the superlattice, $g_m$ is the transconductance of the FET, and $1/R_{int}$ is the superlattice conductance in the growth direction, i.e., between 83 and 86.

Because there are two possible orientations for an asymmetric superlattice one can, for the same type of conductivity in the FET, have the drain current either increasing or decreasing with the illumination.

The response time $\tau$ of the combination exemplified by FIG. 8 can be shown to be $\tau = \tau_g(M+1) + \tau_M$, where $\tau_g = C_g/g_m$ is the small signal gate delay, and $C_g$ the gate capacitance of the FET.

Figure 9:
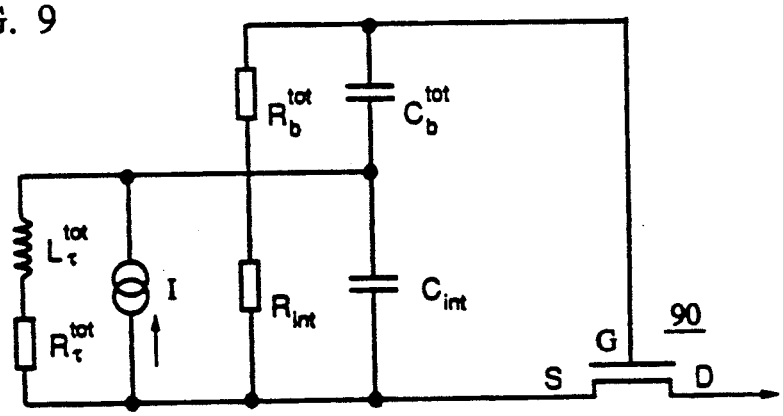
FIG. 9 shows the equivalent circuit of a loaded device according to the invention.

The efficiency $\eta$ can also be expressed as follows: $\eta = (d/2d_g)(\epsilon_g A_g/\epsilon A)(\tau_M/\tau_g)$, where $A_g$, $d_g$, and $\epsilon_g$ are, respectively, the gate area, and the thickness and permittivity of the gate dielectric. In the above expression it is assumed that $N = (\alpha d)^{-1}$ FIG. 9 shows and equivalent circuit that can be used to model a loaded device according to the invention, e.g., the detector/FET combination of FIG. 8. Numeral 90 refers to the FET, with S, G, and D signifying source, gate and drain, respectively. Component values $R_\tau^{tot}$, $L_\tau^{tot}$, $R_{int}$, $C_{int}$, $R_b^{tot}$ and $C_b^{tot}$ are $NR_\tau$, $\tau_e R_\tau^{tot}$, $NR_d$, $C_d/N$, $NR_b$ and $C_b/N$, respectively. $R_\tau$, $R_d$, $C_d$ are defined above. $R_b$ is the resistance associated with a single barrier (it will be zero if the superlattice does not comprise barriers), and $C_b = \epsilon A/b$, where b is thickness of a single barrier.

By way of example, a superlattice/FET combination according to the invention that comprises a state-of-the-art FET with $\tau_g = 5$ ps and a superlattice characterized by $\alpha d = 0.1$ (with $N = 10$) and $\tau_M = 1$ ps, will have an intrinsic response time $\tau \approx 10$ ps at $\eta \approx 5\%$, and $\tau \approx 200$ ps at $\eta \approx 100\%$. The wide range of response characteristics available make possible optimization of combinations according to the invention for a variety of diverse applications.

For instance, small-signal operation at low illumination levels does not require extremely short minority carrier lifetime $\tau_e$. In some cases $\tau_e$ not substantially shorter than $10^{-9}$ s may be acceptable. On the other hand, noise considerations may make it desirable for $\tau_e$ to be substantially less than $ed^2/(2\mu_h kT)$. Exemplarily, assuming room temperature $d \gtrsim 200$ nm and $\mu_h \gtrsim 50$ cm$^2$/V·s, $\tau_e$ advantageously is substantially less than $10^{-10}$s. Such low lifetimes can result, for instance, from low temperature (e.g., $<400°$ C.) MBE deposition of the superlattice material, or can be obtained by means of ion implantation. In this respect, see, for instance, "Semiconductors and Semimetals", Vol. 28, R. B. Marcus, editor, especially pp. 85–98; R. P. Smith et al., *Applied Physics Letters*, Vol. 38(1), pp. 47–50; and P. M. Downey et al., *Applied Physics Letters*, Vol. 46(4), pp. 396–398.

As mentioned above, an exemplary embodiment of the invention involves stimulated emission due to the presence in the superlattice region of electromagnetic radiation of wavelength corresponding substantially to the minimum gap energy. Such an embodiment will exemplarily comprise cleaved facets as in a conventional edge-emitting laser, or planar quarter-wave dielectric mirror stacks as in optically pumped vertical-cavity surface emitting lasers. Both of these types of lasers are well known. See, for instance, D. G. Deppe et al., *Applied Physics Letters*, Vol. 56, pp. 2172–2174 (1990).

Subject to optical pumping G above the lasing threshold level, the electrical behavior of the above referred-to embodiment of the invention is similar to that of the structure of FIG. 4, with $\tau_2$ given by the stimulated radiative lifetime $\tau_r^{st}$, which can be as short as $10^{-13}$ s. The photo-generated voltage in this case is quite accurately described by $V_1 \approx Gd(d-\delta)/(2p_o\mu_h)$.

Under time-varying optical pumping, i.e., $G = G_o + \delta G(t)$, the exemplary embodiment can produce a synchronous combination of the optical and electrical outputs, both faithfully tracking $\delta G(t)$ up to bandwidths in the THz range. Such a device can be used advantageously in optical communication systems. Moreover, the wavelength of the optical output of the device will, under appropriate circumstances, be controllable to some extent by the intensity of the dc pumping level $G_o$. This effect occurs due to the Stark shift by the polarization field of the ground electronic energy level in a sawtooth superlattice.

Figure 10:
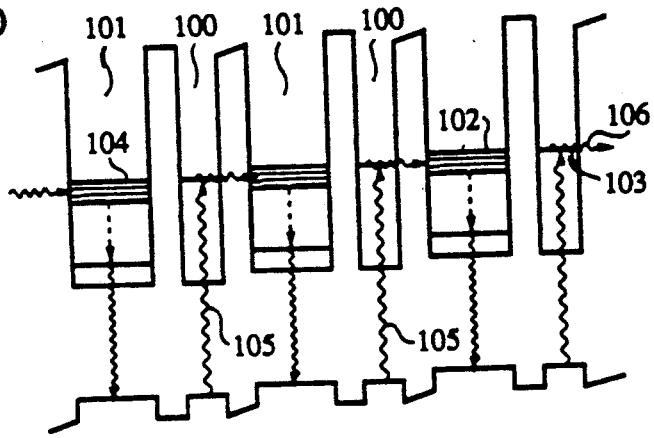

A further exemplary superlattice is schematically depicted in FIG. 10. Each period of the (p-doped) superlattice comprises two quantum wells, one relatively narrow (100) and the other (101) relatively wide, such that asymmetric absorption results, which gives rise to the internal steady-state current and the polarization voltage.

Suppose the first excited energy level (102) of electrons in the wide well is degenerate with the ground level (103) in the narrow well. Optical transitions in the wide well can be suppressed if the linewidth hν (where h is Planck's constant) of the incident radiation is narrower than the lifetime-limited width Γ(104) of the second energy level in the wide-gap well. We assume that the level broadening $\Gamma = 2\pi h/\tau_c$ is caused by intersubband scattering and is about 10 meV, a typical number. Broadening of the ground level in the narrow well, on the other hand, is mainly due to the finite lifetime, $\tau_t$, against the escape from the well by tunneling (106) into the wide well. That broadening is assumed to be of the order of the excitation linewidth, i.e. $\Delta\nu\tau_t \sim (2\pi)^{-1}$ and much smaller than the collision broadening of the wide-well level, i.e., $\tau_t \gg \tau_c$.

Under these conditions, the optical absorption in the wide well is suppressed, compared to that in the narrow well, by a factor $2\pi\Delta\nu\tau_c = \tau_c/\tau_t \ll 1$, and hence illuminating the system with a monochromatic light (105), tuned to the fundamental transition in the narrow well, will mainly generate electron-hole pairs in that well. In the regime $\tau_c \ll \tau_t$, the tunneling rate is practically independent of the actual alignment of the two levels, so long as the narrow level falls within the band $\Gamma$ of the broad level. Even if the recombination times in the two wells are equal, the asymmetry in the absorption rate will cause polarization. The magnitude of this effect depends on the barrier resistance for the hole transport and can be tuned in a wide range. To a reasonable approximation, this situation can be described by the equivalent circuit of FIG. 7 and the component values disclosed in conjunction therewith, where d should now be taken as the separation between the centroids of the electronic wave functions in the two wells, and $\mu_h$ the mobility of holes perpendicular to the superlattice.

The coupled well scheme admits of many further variations, including the design of disparate recombination times in the two wells, the use of stimulated recombination in a resonant cavity, etc. In the limit of extremely short recombination time in the wide well, e.g. provided by the stimulated emission in a resonant cavity, the photovoltage generated per period is limited by the width $\Gamma$ because further voltage would de-tune the tunneling resonance. However, the number of periods can be quite large and polarization voltages of order 1 V seem to be within reach. The response time of the tunneling photo-polarization is determined by $\tau_t$ and can be well in the subpicosecond range before violating the inequality $\tau_c \ll \tau_t$.

It will be appreciated by those skilled in the art that articles according to the invention can be embodied in a variety of material systems, including III/V compound semiconductor systems such as GaAs or InP (and including the related ternary and quaternary systems). In view of the short carrier lifetimes that are a feature of devices according to the invention, embodiments in heteroepitaxial systems such as GaAs on Si are also expected to be of interest.

EXAMPLE I

A device of the type shown in FIG. 8 is produced as follows. On a p-type GaAs substrate are grown by MBE 1 $\mu$m p-type ($10^{16}/cm^3$) GaAs, 50 nm undoped $Al_{0.35}Ga_{0.65}As$, and 100 nm GaAs (Si doped to $10^{19}/cm^3$). After deposition of 400 nm $SiO_2$, standard lithography is used to define the channel area by means of a 1 $\mu$m wide strip of photoresist. From the area not covered by the photoresist, the previously grown material except the buffer is removed by known means, and the source and drain regions are formed by implanting $Si(2\times10^{18}/cm^3)$ to a depth of 200 nm into the uncovered portions. After removal of the photoresist and the $SiO_2$ from the gate region, 500 nm of $SiO_2$ are deposited onto the entire surface, and a 55 $\mu$m wide window is opened in the $SiO_2$ over the source region. In the window is grown the following layer structure by MBE: i) 50 nm $p^+$($10^{19}/cm^3$Be) GaAs etch stop layer, ii) 50 nm $p^+$($10^{19}/cm^3$Be) AlAs; iii) 10 layers (100 nm each) of p-type ($10^{17}/cm^3$Be) graded $Al_xGa_{1-x}As$ (x ramped from 0 to 0.15); and iv) 70 nm $p^+$($10^{19}/cm^3$Be) GaAs. All but layers iii) are grown at conventional temperature (450° C.), but the superlattice iii) is grown at a relatively low temperature (350° C.) to yield material of relatively short minority carrier effective lifetime. The central 50×50 $\mu$m area of the thus formed multilayer structure is covered with photoresist, and the uncovered area of the multilayer structure is removed (down to, but not including, the GaAs etch stop layer). After removal of the photoresist and the remaining $SiO_2$, device isolation and channel width definition are accomplished by standard lithography and chemical mesa etch, resulting in a 5 $\mu$m wide (and 1 $\mu$m long) channel. After deposition of 100 nm of $Si_3N_4$ onto the entire surface, windows are opened in each of the source, superlattice, gate and drain region, and metallization is carried out in conventional manner, with the metallization electrically connecting the superlattice region to the gate. Measurements yield results that are in accord with equations 1 and 2 herein, with $\tau_e < 10^{-9}$ seconds.

EXAMPLE II

A device according to the invention is produced substantially as described in Example I, except that, prior to definition of the 50×50 $\mu$m area on the multilayer structure, the entire surface is exposed to ion bombardment, with the conditions chosen such that $\tau_e$ in the superlattice structure is further reduced.

EXAMPLE III

A further device of the type shown in FIG. 8 is produced as follows. On a lightly doped ($5\times10^{14}/cm^3$) p-type <100> Si substrate are defined the active region (55×65 $\mu$m) and field region of a known FET structure. After conventional growth of 15 nm gate oxide in the active region, B is implanted ($5\times10^{12}/cm^2$, 50 keV) through the gate oxide, a 0.5 $\mu$m layer of poly-Si is deposited over the entire surface and doped in conventional fashion with P to yield a sheet resistance of 20 $\Omega$/square, followed by patterning of the poly-Si to define the channel area. Subsequently the source and drain regions are defined by a self-aligned ion implantation (As, $10^{16}/cm^2$, 30 keV), and the implanted atoms activated, all in conventional manner. The channel is positioned such that the source region is of size 55×55 $\mu$m. Next, a CVD-nitride layer (500 nm) is deposited, a resist layer formed thereon and patterned such that a 55×55 $\mu$m window is opened over the source region. In the window region the nitride and gate oxide are removed by anisotropic etching, followed by removal of the photoresist. In the window region is then grown the following multilayer structure: i) 100 nm $p^+$($10^{19}/cm^3$Be) GaAs etch stop layer, ii) 50 nm $p^+$($10^{19}/cm^3$Be) AlAs; iii) a 10-layer superlattice as described in Example I; and iv) 70 nm $p^+$($10^{19}/cm^3$Be) GaAs. The multilayer structure is grown by MBE as described in Example I. After covering a 50×50 $\mu$m area in the center of the multilayer region with photoresist, the uncovered portion of the structure is removed by mesa etching down to the top of the GaAs etch stop layer, and the photoresist and the nitride are removed. Finally, 100 nm CVD nitride is deposited, windows for the source and drain contacts and the superlattice-to-gate interconnection are opened by dry-etching away the nitride and residual gate oxide, and metallization applied, all in known manner. Measurements yield results that are in accord with equations 1 and 2 herein, with $\tau_e < 10^{-9}$ seconds.

We claim:

1. An article comprising
   a) a semiconductor body having a major surface and comprising a doped region whose chemical composition varies periodically as a function of distance from the surface, the region to be referred to as the "superlattice region", the superlattice region having a minimum bandgap energy $\Delta$ and a minority carrier lifetime $\tau_e$ at the region of minimum bandgap energy, the compositional variation in the superlattice region being such that the region lacks reflection symmetry in the direction normal to the surface; and
   b) means for making electrical contact with the body such that a voltage across the superlattice region can be provided to responsive means;

CHARACTERIZED IN THAT c) the minority carrier lifetime $\tau_e$ is less than $10^{-9}$ second, and furthermore is selected such that a constant flux of electromagnetic signal radiation of frequency $\nu > \Delta/h$ impinging on the body can result in a substantially constant voltage across the superlattice region, said voltage being substantially proportional to the radiation flux for relatively small values of the flux, and saturating at a value $V_{max}$ that is at least N times 0.01 volt for relatively large values of the flux, where N, the number of superlattice periods, is an integer greater than or equal to 1, and where h is Planck's constant.

2. The article of claim 1, wherein $N \approx 3$.

3. The article of claim 1, further comprising a field effect transistor comprising a gate, a source and a drain, and gate electrically connected to said means for making electrical contact with said semiconductor body.

4. The article of claim 3, wherein the field effect transistor is integrated with said semiconductor body.

5. The article of claim 1, further comprising a bipolar transistor comprising a base, an emitter and a collector, said base electrically connected to said means for making electrical contact with said semiconductor body.

6. The article of claim 5, wherein the bipolar transistor is integrated with said semiconductor body.

7. The article of claim 1, wherein the chemical composition varies substantially in sawtooth-fashion as a function of distance.

8. The article of claim 1, wherein the superlattice region has a maximum bandgap energy $\Delta_{max}$, and wherein $\nu$ is approximately equal to or larger than $\Delta_{max}/h$.

9. The article of claim 1, further comprising reflective means disposed to form an optical cavity that contains said semiconductor body, and means for coupling into the semiconductor body electromagnetic pump radiation of frequency equal to or greater than $\Delta/h$ but less than the signal radiation frequency.

10. The article of claim 1, wherein the semiconductor body comprises Si, and further comprises compound semiconductor material grown epitaxially on the Si.

* * * * *